United States Patent [19]

Schwenkler

[11] Patent Number: 5,226,242
[45] Date of Patent: Jul. 13, 1993

US005226242A

[54] VAPOR JET DRYER APPARATUS AND METHOD

[75] Inventor: Robert S. Schwenkler, Boise, Id.

[73] Assignee: Santa Clara Plastics, division of Preco, Inc., Boise, Id.

[21] Appl. No.: 837,221

[22] Filed: Feb. 18, 1992

[51] Int. Cl.⁵ .............................................. F26B 21/06
[52] U.S. Cl. ................................. 34/78; 34/27; 34/73; 134/105
[58] Field of Search ............... 34/73, 74, 77, 78, 79, 34/27, 60, 218, 242; 134/105, 21

*Primary Examiner*—Henry A. Bennet
*Assistant Examiner*—Denise L. F. Gromada
*Attorney, Agent, or Firm*—Limbach & Limbach

[57] ABSTRACT

The present invention provides a vapor processing apparatus in which the vapor is generated in a region adjacent to the vapor processing area. This is generally done in a batch process and a limited volume of processing vapor is generated for each batch. The separation of the vapor generation from the processing avoids the contamination of the vapor source and the inadvertent cooling of the vapor generating area. In the preferred embodiment, two vessels are disposed one inside the other such that a vapor generating region is provided in the annular space between vessels. The vapor is injected into the processing region through channels formed in the annular space. In a preferred embodiment, the vapor is isopropyl alcohol and the substrates for processing are silicon wafers.

18 Claims, 2 Drawing Sheets

VAPOR JET DRYER APPARATUS AND METHOD

TECHNICAL FIELD

The present invention relates generally to vapor processing apparatus. More particularly, the present invention relates to a new and improved apparatus and method for vapor processing a batch of substrates, including silicon wafers used in the manufacture of semiconductors.

BACKGROUND OF THE INVENTION

The manufacture of semiconductor wafers involves several chemical treatment steps, including some wet processing steps. These wet processing steps are typically followed by liquid rinsing and drying of the wafers. There are known numerous devices and methods for using vapor processing to dry the wafers after the liquid rinsing steps.

In one class of prior methods, a vapor processing zone is formed over a reservoir of continuously boiling isopropyl alcohol ("IPA"). This vapor processing zone is contained by walls which enclose the four sides and by the reservoir at the bottom. A cooling coil is provided at the top of the processing zone. The substrates are loaded into the processing zone through the cooling coils on an elevator transport arm which moves them down through the cooling coils into the vapor processing zone for the required drying time. The substrates are then withdrawn back up through the cooling coils. A variation on this top loading method involves side loading and horizontal transport of the substrates through the vapor zone. Both approaches, however, utilize the common concept of moving the substrates through an active vapor processing zone produced by an adjacent reservoir of continuously boiling liquid.

This boiling reservoir-generated vapor processing zone approach has several significant drawbacks. Since the amount of vapor discharged to the atmosphere from the processing zone is a function of the cooling coil design, there are potential environmental control problems caused by the open areas through which the substrates must pass into and out of the cooling coils. The vapors passing through these open areas do not contact the cooling coils, and are therefore discharged to the atmosphere. There are also substantial safety hazards resulting from IPA's high flammability and explosiveness. Some of the existing devices utilize plate heaters operating at temperatures over 150 degrees Centigrade, well into the critical range for IPA flammability (flashpoint $\sim 12°-21°$ C.) and explosiveness (autoignition point $\sim 310°$ C.). It is also the prior art practice to utilize quartz vessels for vapor generation. The fragility of these vessels and the proximity of the solvent to the heaters makes these processes inherently dangerous.

The mechanical substrate transport system described above adds further complexity to the drying process, and provides another potential contamination source in a demanding "clean" environment.

Another significant operating problem with this boiling reservoir approach is that the amount of vapor present in the vapor processing zone is an equilibrium phenomenon. As the cool substrates are lowered into the vapor processing zone, and vapors condense on the substrate surfaces, the vapor cloud initially present in the processing zone essentially collapses. It then takes time for the boiling reservoir to rebuild the "collapsed" vapor cloud. We refer to this phenomenon as "bottom-up vapor processing." This bottom-up vapor processing is problematic, even more so with hydrophilic wafers and patterned wafers. These wafers tend to hold water on their surface, and only have the bottom portion of water cleansed from the wafer surface upon initial descent into the vapor zone because the vapor cloud collapses in response to the cool wafers and cool wafer carrier which act like cooling coils. There follows a period of vapor cloud rebuilding which occurs as the wafers heat up from the condensing IPA vapors. As the vapor cloud recovers from the bottom up, droplets of water are absorbed by the IPA which dilute and/or contaminate the IPA which wets the lower portion of the wafers. It is also possible that micro-droplets of water will dry on the top portions of the wafer before the recovering vapor cloud envelopes the wafers. This results in undesirable water residue spots. This condition is aggravated by the reduced condensation rate on the upper portion of the wafers as they heat up.

Previous investigators' attempts to overcome these serious drawbacks with the boiling reservoir-generated vapor zone are not without their own problems. For example, efforts to reduce the collapsed vapor cloud recovery time by increasing the boiling rate of the IPA reservoir also increase the entrainment of impurities in the IPA. Efforts to reduce the collapsed vapor cloud recovery period by heating the sidewalls of the vapor processing zone tend toward aggravation of the previously described IPA explosive hazards. It is also apparent that the continuous vapor formation by the boiling reservoir and vapor condensation by the cooling coils between and during dryer cycles is unnecessarily energy intensive and wasteful.

In a different prior approach to vapor phase drying, the IPA vapor is generated external to the vapor processing zone and to the dryer itself, and then imported to the processing zone. This method has a number of drawbacks, the most significant of which is the inability of this approach to provide an adequate supply of pure vapor to the processing zone in a uniform manner to process a batch of substrates. The generation of vapor at a remote source is followed by transport of the vapor through a tube to the processing area. This tube can undesirably restrict the amount of vapor which is available for processing. Since uniform vapor coverage is critical to the prevention of premature water microdroplet drying these vapor transport limitations adversely effect the process performance. When the IPA boiling rate is increased in an attempt to increase vapor density and to provide uniform coverage, it results in increased impurities concentration in the IPA vapor. The use of an external IPA vapor source can also contribute to substrate processing control system complexity, e.g., build up of contaminants in the IPA source liquid.

SUMMARY OF THE INVENTION

The present invention solves these drawbacks of the prior methods by providing a heated, sealable process chamber wherein a predetermined amount of processing vapors are generated within the process chamber without need for a large, continuously boiling IPA reservoir. The present system provides a uniform concentrated vapor cloud which safely, efficiently and completely removes the rinse water from the substrates. The present invention minimizes vapor loss to the environment and minimizes the explosive hazard conditions inherent in IPA processing. This vapor processing system does not require any complex elevator transport mechanisms for loading and unloading which greatly simplifies operation, enhances reliability and eliminates a potential contamination source.

In contrast to the bottom-up vapor processing techniques of the prior art, the present invention employs "top-down" vapor action in which a dense, uniform IPA vapor is directed onto the upper portion of the substrates, along the full length of the substrate carrier. This configuration enables a chamber with simple top-loading. It also enables rapid water displacement from the substrate with no chance of micro-droplet drying.

The separation of the vapor generation means from the vapor processing zone according to the present invention consistently provides highly pure vapors. Further, the in-situ clean feature of the invention eliminates the build up of inherent solvent impurities in the vapor generating means after solvent evaporation.

The present invention provides a vapor generation region which includes a large surface area and a vapor assisting flow of heated inert gas to maximize vapor generation at lower temperatures. This eliminates the need to operate at higher temperatures to enhance boiling, and eliminates the generation of impure vapors from vigorously boiling liquids.

These and further objects of the present invention will be apparent to those of ordinary skill in the art with reference to the figures and detailed in the art with reference to the figures and detailed description set forth below.

DETAILED DESCRIPTION OF THE INVENTION

Figure 1:
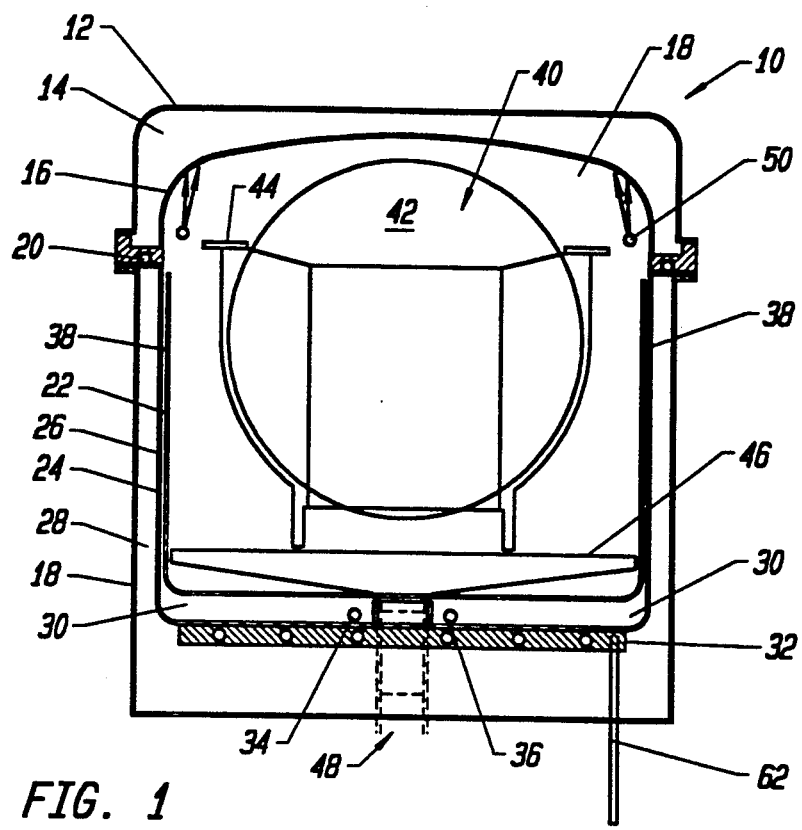
FIG. 1 is a plan view of the vapor jet dryer.

The present invention is described here with respect to a particularly preferred embodiment in which isopropyl alcohol is used to dry silicon wafers. It will be recognized by those of ordinary skill in the art that this device and method can be used to practice a variety of vapor processing techniques, on a variety of substrates with a variety of processing vapors. The use of the IPA/silicon wafer example is intended to be illustrated and not limiting.

Before moving on o describe the specific apparatus of the invention, the basic operating principles will first be described. According to the present invention, the vapor processing chamber has an inner vessel and an outer vessel and which are disposed relative to each other so as to create an annular space between them. In this particular embodiment, the vessels are the same overall shape, but the inner vessel is smaller than the outer vessel. However, it is not essential that the vessels have the same shape. Vapor generation takes place in the annular space between the bottom walls of the two vessels. A base heater plate along the bottom wall of the outer vessel provides the heat required to vaporize the liquid IPA, or other liquid. Heated nitrogen is also provided to the vapor generation area to assist in the efficient generation of vapors, and to enhance safety of the process. The generated vapor, and vapor-assisting heated nitrogen, then flow into the annular space between the two vessels above the region in which the vapor is generated. In the preferred embodiment described here, where the vessels have a quadrilateral horizontal cross-section, the vapors are conducted to flow in two parallel sides of the quadrilateral cross-section while the other two sides are occluded to prevent vapor flow. While this is preferred, it is not essential to block off two sides. The two vapor streams meet at the top of the vapor processing zone where they mix and roll downward onto the substrates located below in the processing zone in the inner vessel. This provides the so-called "top down" processing characteristic of the present invention.

A drip tray is provided in the bottom of the inner vessel, raised above the bottom wall of the inner vessel. The substrates to be processed are held in a carrier which is placed upon the drip tray. Vapors condensing on the substrates are captured by the drip tray and then withdrawn from the process chamber through a drain at the bottom of the inner vessel. The drip tray is sloped towards the drain to provide rapid removal of the condensed vapors to reduce the possible introduction of contaminants into the chamber through re-evaporation. The drip tray is raised above the bottom wall of the inner vessel to eliminate any cooling effect on the vapor generation taking place in the annular space below the inner vessel bottom wall.

Two additional features are provided. First, the vapors and liquids withdrawn through the drain in the bottom of the drip tray are passed through a heat exchanger to recover any condensable vapors. Recyclable liquids can be collected and separated or disposed. This heat exchanger prevents the undesirable exhaust of vapors from the dryer to the atmosphere. Second, the effect of build up of the impurities inherent in the solvent (as opposed to the impurities introduced into the solvent by contact with the substrates and condensed vapors) is minimized by an in situ cleaning process. This process provides for the introduction of a slight excess amount of the processing fluid into the vapor generation region. Before all of the liquid is evaporated, a small drain in the vapor generation region is opened to withdraw the remaining processing liquid which has a high concentration of the inherent impurities. This prevents the deposition and build up of these impurities on the vapor generation region surfaces. This in situ clean also prevents the boil up of impurities into the generated vapor.

A preferred embodiment of the present invention is shown in FIG. 1. The vapor jet dryer 10 has a chamber lid 12 which lifts open to receive the substrates to be processed. The lid 12 has insulation in the region between the outer surface of the lid 12 and the heated inner lid surface 16. Lid surface 16 is heated with a silicon blanket heater to prevent the condensation of IPA vapors on cool surfaces inside of the chamber 18. The outer surfaces of the dryer 10 are fabricated from stainless steel. The heaters are sealed in this space to prevent contact with vapors. The space is purged with nitrogen to eliminate sparks and the potential for explosion or fire.

Chamber lid 12 has an O-ring seal and gasket 20 to permit operation of the chamber 18 at positive pressure.

Chamber 18 has an inner vessel 22 which is constructed of TP 316L stainless steel which is electropolished on the wetted surfaces. Chamber 18 also has an outer vessel 24 fabricated from stainless steel. The outer vessel surfaces exposed to the IPA vapors (its inside surfaces) are electropolished. The inner vessel 22 is disposed inside of the outer vessel 24 and held in place using spacers which are inert to the process conditions, in a preferred embodiment, Teflon ®spacers. The outer vessel 24 is heated by silicon blanket heaters 26 disposed on its outer surface and insulated by insulating materials 28 placed in the space between the outer vessel 24 and dryer outer wall. These heaters are provided on the vessel surface to prevent condensation of vapors on the cool walls of the chamber. The heaters are sealed in this space by gaskets (not shown), and nitrogen is passed through this space to create a positive pressure to minimize sparks, eliminate oxygen and vapors, and reduce the potential for explosion or fire. In a preferred embodiment, loss of nitrogen purge in these spaces is detected by a pressure sensor which is part of an emergency shut down system.

There are two significant reasons for using two vessels, one disposed inside of the other: first, to provide an annular space between the inner vessel 22 and the outer vessel 24 to form a vapor generation region 30. The bottom wall of the outer vessel 24 is adjacent to a base heater plate 32 which is used to vaporize IPA entering the vapor generation region 30 through the IPA inlet 34. This arrangement of the two vessels permits the separation of the vapor generation process from the vapor processing of the substrates. This configuration achieves a high purity zone for vapor generation from the processing liquid, free from contamination by residue or water drips from the vapors condensing on the substrates undergoing processing back into the processing liquid. A vapor assist bar 36 is further provided in the vapor generation region 30. This vapor assist bar provides heated nitrogen to the vapor generation area to assist in the vaporization process. It also enhances safety by decreasing the explosive vapor dangers since this region is maintained under a nitrogen atmosphere.

The second purpose of a double vessel configuration is to provide vapor injection channels 38 in the annular spaces between the vessel side walls. According to this configuration, the vapor generated in the vapor generation region 30 is forced to move up and into the vapor injection channels 38. These channels flow into the top of the chamber 18, and flow along the heated lid surface 16. This vapor flow permits uniform top down vapor dispersion into the processing zone 40. Since the vapor generation takes place within the chamber, the transport limitations of prior art devices are avoided.

While the preferred embodiment has been described with reference to two vessels, one disposed inside of the other, it is apparent to those of ordinary skill in the art that the same purpose can be achieved using a similar, but slightly different, configuration. It is possible to have a vapor generating region adjacent to the processing zone without having to provide two distinct vessels, one fit inside of the other. It is also possible to have a side loaded device which practices the basic principles of the present invention with a separate area for generation of vapor and a separate area for vapor processing.

The vapor generation step is explained with reference to FIG. 1. A predetermined volume of IPA is introduced into the vapor generation area 30 through IPA inlet 34. The IPA is provided from a source remote from the dryer 10, and not shown in FIG. 1. The IPA system is described below with reference to FIG. 3. Inlet 34 is a portal in the outer vessel 24 bottom wall made by welding a TP 316L electropolished tube to the outer vessel 24. The use of a weld to attach the inlet 34 to the vessel wall allows the positive sealing of the vapor generating region 30.

Figure 2:
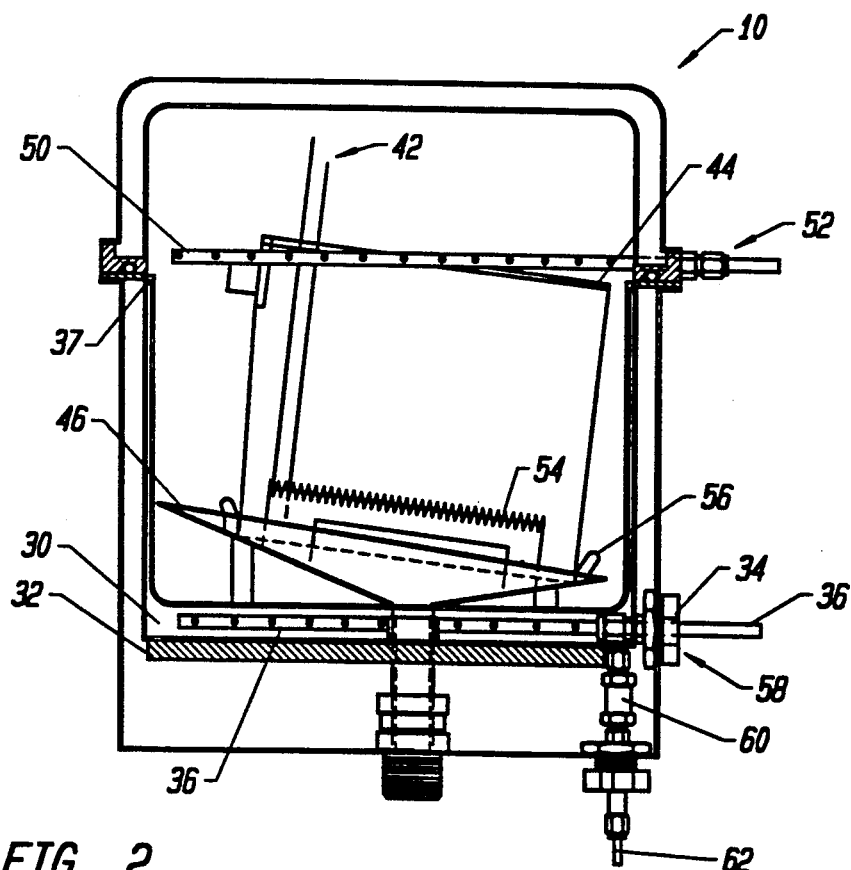
FIG. 2 is a side elevation of the vapor jet dryer.

The IPA liquid enters the vapor generation region 30 and spreads out over the vessel wall adjacent to the base plate heater 32 for maximum heating and a large vapor generation area. The vapor assist bar 36 extends horizontally across the vapor generation area 30 in the same direction as the vapor injection channels 38. As shown in FIG. 2, these annular spaces are blocked with Teflon ® spacers 37 on the chamber sides parallel to the major plane waferlike substrates to be processed. On the perpendicular sides, these annual spaces are open. Vapor assist bar 36 disperses a low flow of heated nitrogen gas across the surface of the liquid IPA in the vapor generation region. This heated gas speeds the evaporation process and assists in the flow of generated vapor up through the injection channels 38 which are disposed perpendicular to the major plane of the wafers.

The vapor exiting from the vapor injection channels 38 follows the contour of the heated lid surface 16. There results a gentle mixing rolling action in the top of the chamber which ensures dense uniform vapor distribution along the wafers 42 held in carrier 44, all held in the processing zone 40. The carrier 44 rests upon a drip tray 46 where liquids resulting from the condensed vapors are captured and drained from the dryer through drain 48. This drip tray 46 provides several benefits to this process design. It is designed to slope inward towards the drain 48 so that any liquids are rapidly removed from the vapor processing zone. This prevents the "re-evaporation" of any water removed from the substrates, as well as any other volatile contaminants. The placement of the drip tray above the inner vessel 22 wall eliminates the effect of condensed vapors on the generation of vapors in region 30.

At the top of the chamber 18 is a nitrogen purge manifold 50. When practicing the preferred method, the nitrogen purge manifold 50 is used to introduce heated nitrogen into the chamber to complete the drying process.

FIG. 2 shows a different view of the dryer 10. Pivot point 52 provides the opening and closing capability for the chamber lid 12. Inside of the dryer 10, a series of wafers 42 are shown in carrier 44. This view shows the wafer lifter comb 54 for receiving wafers. The wafer lifter comb 54 is fabricated from machined or molded teflon. The comb design is intended to lift the wafers from the bottom of the carrier 44 to enhance the drying action in the processing zone 40. This comb minimizes water staining which can be caused by known Teflon ® cassettes. The drip tray 46 has pegs 56 which help to locate the carrier 44 in the correct position.

FIG. 2 provides a detailed view of the insitu cleaning apparatus. Portal 58, welded for integrity similar to IPA inlet 34, is provided in the bottom wall of the outer vessel 24 in the vapor generation area 30. This portal communicates with check valve 60 and aspirator tube 62. This apparatus permits the withdrawal of an intended excess of IPA from the vapor generation region 30. As discussed above, IPA inherently contains impurities which can accumulate on the evaporation surface in the region 30. According to the in situ cleaning method of the present invention, an excess of IPA (about 20 cc) is added to the vapor generation region 30. This extra IPA is removed from the vapor generation region by means of nitrogen-driven aspiration through portal 58, check valve 60 and aspiration tube 62. This in situ cleaning procedure can be performed every cycle, or once every five cycles. A more complete description of the aspiration cycle is set forth below with respect to the block process flow diagram of FIG. 3.

Figure 3:
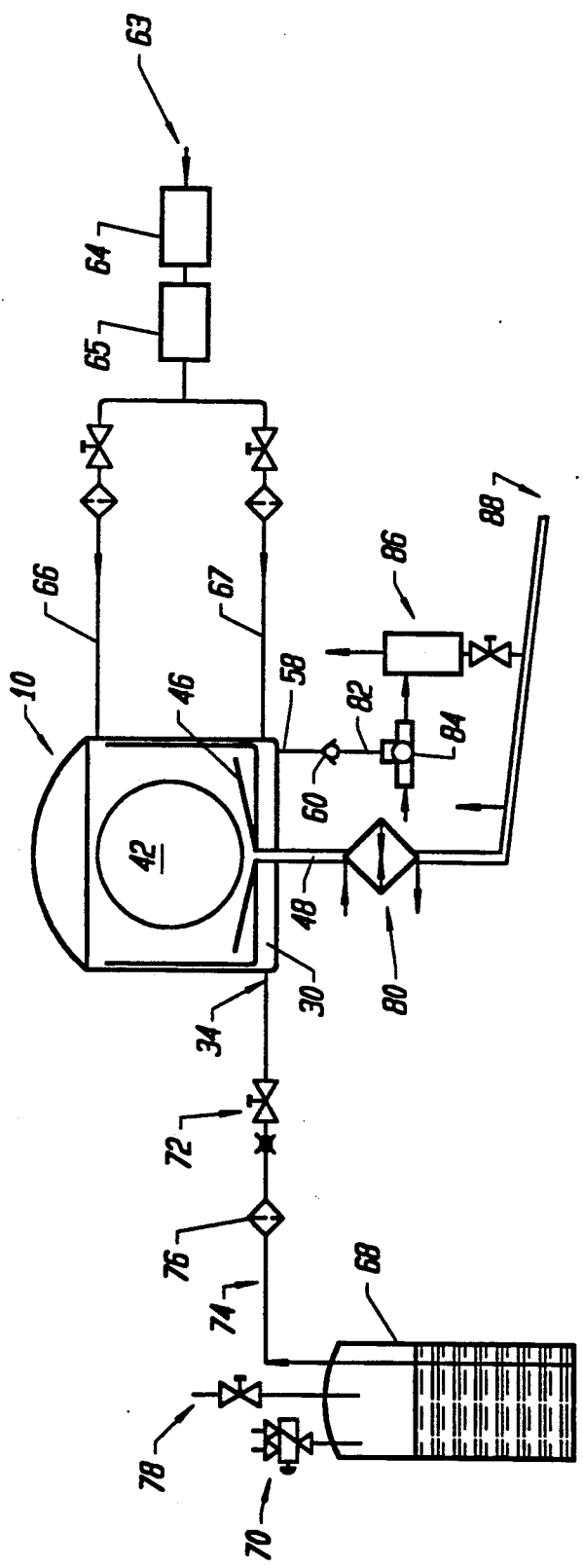
FIG. 3 is a block diagram of the vapor jet dryer and its auxiliary equipment.

The dryer 10, with wafer 42, drip tray 46 and drain 48, along with some of the supporting equipment for practicing the method of the present invention are shown in FIG. 3. This block diagram is intended to show the features of the present invention which are most germane to the claimed invention. Those of ordinary skill in the art will recognize that various safety and process control features can be added to this block diagram while still within the spirit and scope of the present invention. The nitrogen source 63 is fed to a nitrogen flow controller 64 and then to a nitrogen heater 65. Nitrogen is used in two different applications. One nitrogen line 66 is fed to the nitrogen manifold 50 (not shown in this view). This nitrogen line is used in the final part of the drying cycle. The second nitrogen line 67 is fed to the vapor assist bar 36 which is used to flow heated nitrogen over the liquid IPA during the vapor generation phase.

The IPA system is shown in FIG. 3. The IPA is stored in an IPA pressure storage tank 68 which is an ASME approved pressure vessel, preferably having an electropolished stainless steel interior surface. When it is desired to dispense IPA liquid into the dryer 10, the storage tank 68 is pressurized through a three-way valve 70 which has nitrogen ingress and egress, along with a connection to IPA tank 68. Normally, the IPA tank 68 is vented to exhaust to maintain ambient pressure. In the dispense modes, the storage tank 68 is pressurized with nitrogen to approximately 20 psig. When dispense valve 72 is open, IPA flows from the pressurized tank through line 74 and filter 76, through the metering orifice in the valve 72, and then into the IPA inlet 36 and the vapor generation region 30. Valve 72 has a metering orifice, which in the preferred embodiment, has its VCR face sealed off with a blank off gasket. A hole of 0.06 inches diameter is drilled in the gasket to regulate flow. This metering valve is preferably located close to the dryer 10.

In a preferred embodiment, there are two redundant valves to dispense IPA, one behind the filter 76 and one after the filter.

One of the environmental control aspects of the present invention is shown in FIG. 3. A heat exchanger 80 is used to remove condensable vapors from drain 48 through which the condensed vapors and gases flow out of the dryer 10. The use of heat exchanger 80 in the drain line minimizes or, if desired, eliminates the discharge of IPA vapors into the atmosphere. The preferred heat exchanger is a shell and tube heat exchanger having TP 316L stainless steel tubes whose inner surfaces are electropolished. It is preferable to have the exhaust gases flow through the inside of the tubes with cooling water in the shell. The cooling system efficiency is maximized by a large condensing surface area and by controlling the temperature of the cooling fluid. This feature of the system is particularly desirable for use of the equipment in jurisdictions with strict emissions controls, such as California.

A different perspective of the in situ cleaning apparatus of the present invention is shown in FIG. 3. Vapor generation region 30 has an IPA liquid drain through portal 58, check valve 60, line 82 and a nitrogen-assisted aspirator block 84. The aspirator block 84 communicates with a vapor liquid separator 86 which directs fluids into drain 88.

Figure 4:
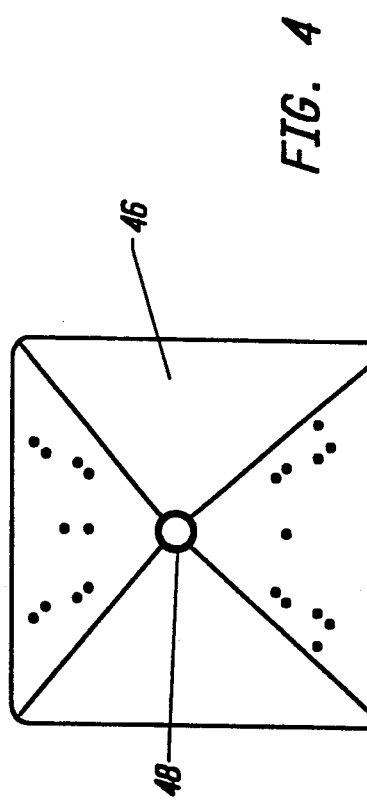
FIG. 4 is a plan view of the drip tray of the vapor jet dryer, according to a preferred embodiment.

A more detailed view of the drip tray 46 is shown in FIG. 4. FIG. 4 shows that the drain 48 in the drip tray is not centered, but is disposed slightly to one side. This view of the drip tray 46 is illustrative of the way in which the tray is configured so as to result in the differing side profiles of the drip tray seen in FIGS. 1 and 2.

While the present invention has been described with respect to the use of IPA as a drying agent in semiconductor fabrication processing, it is recognized that the apparatus and method of the present invention can be used for a variety of other processes, such as chemical photoresist stripping with NMP, ST-22 and other strippers. The present invention can also be used with organic solvents for high purity cleaning and degreasing of wafers and circuit boards. It can also be used for vapor phase film deposition such as from organosilanes and polyimides.

What is claimed is:

1. An apparatus for vapor processing of a batch of substrates which comprises:
    a) a heated sealable process chamber, having an inner vessel for receiving said batch of substrates, and an outer vessel, said two chamber vessels disposed relative to each other to form an annular space between them, said annular space communicating with an upper region of said process chamber;
    b) vapor generating means disposed in said process chamber annular space including,
        (i) a fluid inlet
        (ii) an inert gas inlet
        (iii) heating means, and
        (iv) at least one vapor inject channel for introducing the vapor generated by the interaction of said fluid, inert gas and heating means into an upper region of said chamber inner vessel; and,
    c) a drip tray disposed in a bottom region of said chamber inner vessel for collecting condensed liquid from said batch of substrates, said drip tray having a drain sealably communicating externally of said process chamber, for removal of said condensed liquids and process exhaust gases from said chamber inner vessel.

2. An apparatus according to claim 1 wherein said process chamber further comprises an inert gas manifold located in the upper region of said process chamber.

3. An apparatus according to claim 1 wherein said vapor generating means vapor inject channel is formed by selectively blocking portions of the annular space between said vessels to reduce the cross sectional area through which said generated vapors flow.

4. An apparatus according to claim 1 wherein said vapor generating means further comprises a vapor assist bar connected to said inert gas inlet to disperse a flow of inert gas across the surface of the fluid in said vapor generating means annular space to assist the vapor generation process.

5. An apparatus according to claim 1 wherein said vapor generator means further comprises a valved drain for removing fluid from said annular space.

6. An apparatus according to claim 1 wherein said drip tray is adapted to slope downwardly towards said drain.

7. An apparatus according to claim 1 wherein said drip tray is adapted to receive a substrate carrier.

8. An apparatus according to claim 1 wherein said apparatus further comprises a heat exchanger, external to said process chamber, located in a process line leading from said inner vessel drip tray drain, to remove condensable vapors from said process exhaust gas.

9. An apparatus according to claim 1 wherein said apparatus is configured to receive substrates for processing at the top of said chamber.

10. An apparatus according to claim 1 wherein said apparatus is configured to receive substrates for processing at the side of said chamber.

11. An apparatus according to claim 1 wherein said apparatus is configured to operate in a batch mode.

12. An apparatus according to claim 1 wherein said apparatus is configured to operate in a continuous mode.

13. A method for vapor processing of a batch of substrates which comprises the steps of:
  a) providing a vapor processing apparatus including (i) a heated, sealable process chamber having an inner vessel and an outer vessel disposed relative to each other to form an annular space between them which communicates with an upper region of said process chamber; (ii) vapor generating means disposed in said process chamber annular space having a fluid inlet, an inert gas inlet, heating means and at least one vapor inject channel for introducing the vapor generated by the interaction of said fluid, inert gas and heating means into an upper region of said chamber inner vessel; and (iii) an exhaust and drain system to remove condensed vapors and gases from said process chamber inner vessel;
  b) providing a fluid source;
  c) providing an inert gas source;
  d) providing a batch of substrates to said vapor processing apparatus;
  e) sealing said batch of substrates inside of said process chamber;
  f) generating a predetermined volume of processing vapors inside of said process chamber by providing a predetermined volume of fluid from said fluid source to said vapor generating means and by providing heated inert gas from said inert gas source to said vapor generating means;
  g) after the generation of said predetermined volume of processing vapors, providing a flow of heated inert gas to said process chamber to dry said substrates and to displace the remaining vapors; and,.
  h) opening said process chamber to remove said batch of processed substrates.

14. A method according to claim 13 wherein said fluid is selected from the group consisting of isopropyl alcohol, freon, NMP, ST-22, CFC-113, 111 trichlorocthane, acetone, alcohols and combinations thereof.

15. A method according to claim 13 wherein said inert gas is selected from the group consisting of nitrogen and argon.

16. A method according to claim 13 wherein said substrate is selected from the group consisting of a silicon wafer, germanium wafers, precision parts.

17. A method according to claim 13 further comprising an aspirating step between said generating step (f) and said providing step (g), said step comprising aspirating any liquid remaining in said vapor generating means through a valved drain in said outer vessel.

18. A method for vapor phase processing of a substrate which comprises the steps of:
  a) providing a vapor phase processing apparatus including (i) a vapor generating means with a large surface area exposed to a heat source and with a heated inert gas source directed towards the surface of the vapor-generating liquid; (ii) a vapor processing zone, spatially distinct from said vapor generating means; and, (iii) an exhaust and drain system for removing fluids from said vapor processing apparatus, said exhaust and drain located at the bottom of said vapor processing zone;
  b) for each substrate presented for processing, providing as predetermined volume of processing liquid to said vapor generating means along with a predetermined volume of heated inert gas so as to form a uniform vapor available for processing said substrate,
  c) directing said generated uniform vapor towards the top of said vapor processing zone for interaction with said substrate; and
  d) removing any liquids or vapors present in said vapor processing zone through said exhaust and drain.

* * * * *

UNITED STATES PATENT AND TRADEMARK OFFICE
CERTIFICATE OF CORRECTION

PATENT NO.  : 5,226,242
DATED       : July 13, 1993
INVENTOR(S) : Robert S. Schwenkler It is certified that error appears in the above-indentified patent and that said Letters Patent is hereby corrected as shown below:

In Col. 2, Line 48, "drying" should be "drying,"

In Col. 3, Line 33, "plan view" should be "front elevation"

In Col. 3, Line 52, "on o" should be "on to"

In Col. 6, Line 5, "wall" should be "floor"

Signed and Sealed this

Twenty-ninth Day of March, 1994

Attest:

BRUCE LEHMAN

*Attesting Officer*      *Commissioner of Patents and Trademarks*